(12) United States Patent
Ishizaka (10) Patent No.: US 7,645,484 B2
(45) Date of Patent: Jan. 12, 2010

(54) METHOD OF FORMING A METAL CARBIDE OR METAL CARBONITRIDE FILM HAVING IMPROVED ADHESION

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 109 days.

(21) Appl. No.: 11/393,872

(22) Filed: Mar. 31, 2006

(65) Prior Publication Data

US 2007/0231487 A1 Oct. 4, 2007

(51) Int. Cl.
*C23C 16/00* (2006.01)
(52) U.S. Cl. .................. 427/249.17; 427/577
(58) Field of Classification Search ............. 427/248.1, 427/249.1, 569, 228, 249.17–249.19
See application file for complete search history.

(56) References Cited

U.S. PATENT DOCUMENTS

| 2002/0066411 A1* | 6/2002 | Chiang et al. ............... 118/724 |
| 2002/0144657 A1* | 10/2002 | Chiang et al. ............. 118/723 E |
| 2003/0124264 A1* | 7/2003 | Holfter et al. .............. 427/421 |
| 2004/0219784 A1* | 11/2004 | Kang et al. ................ 438/653 |
| 2006/0019495 A1* | 1/2006 | Marcadal et al. ............ 438/683 |

OTHER PUBLICATIONS

Hong et al, Characteristics of PAALD-TaN Thin Films Derived from TAIMATA Precursor for Cooper Metallization, IEEE, 2004, p. 9-11.*
Kim et al, Characteristics of Tungsten Carbide Films Prepared by Plasma-Assisted ALD Using Bis(tert-butylimido)bis(dimethylamido)tungsten, Journal of Electrochemical Society, 150 (10), 2003, C740-C744.*
Laurila et al, Tantalum Carbide and Nitride Diffusion Barriers for Cu Metallisation, Microelectronic Engineering 60 (2002), p. 71-80.*
Park et al, Plasma-Enhanced Atomic Layer Deposition of Ta-N Thin Films, Journal of Electrochemical Society, 149 (1) C28-C32, 2002.*

* cited by examiner

*Primary Examiner*—Timothy H Meeks
*Assistant Examiner*—Elizabeth Burkhart
(74) *Attorney, Agent, or Firm*—Oblon, Spivak, McClelland, Maier & Neustadt, L.L.P.

(57) ABSTRACT

A method for forming a metal carbide or metal carbonitride film on a substrate using a vapor deposition process. The method includes comprises introducing a first process material, such as a film precursor, to the substrate followed by introducing a second process material, such as a film reducing agent, to the substrate, whereby plasma can be formed during the introduction of the second process material in order to assist reduction of the first process material on the substrate. Additionally, the temperature of the substrate is elevated to a value approximately equal to or greater than the decomposition temperature of the first process material in order to improve adhesion properties for the metal carbide or metal carbonitride film.

25 Claims, 7 Drawing Sheets

METHOD OF FORMING A METAL CARBIDE OR METAL CARBONITRIDE FILM HAVING IMPROVED ADHESION

BACKGROUND OF THE INVENTION

1. Field of Invention

The present invention relates to a method for forming a thin film on a substrate using a vapor deposition process, and more particularly to a method of preparing a thin film having acceptable adhesion properties for subsequent thin film deposition.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine trenches or within vias or contacts patterned on a silicon substrate. Alternatively, for example, a vapor deposition process is utilized to deposit material along fine lines or within vias or contacts on a silicon substrate. Vapor deposition processes include chemical vapor deposition (CVD) and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternatingly and sequentially in order to form a material film one monolayer at a time. Such an ALD process has proven to provide improved uniformity and control in layer thickness, as well as conformality to features on which the layer is deposited. However, current ALD processes can produce films with poor barrier properties and poor adhesion properties despite their superior conformality. Further, current ALD processes may be time consuming, which reduces device manufacturing throughput.

SUMMARY OF THE INVENTION

Accordingly, one embodiment of the present invention is to improve the adhesion properties of metal carbide or metal carbonitride films for subsequent thin film deposition.

Another embodiment of the invention is to increase deposition rates of metal carbide or metal carbonitride films, while maintaining acceptable conformal coverage of step features.

Still another embodiment of the invention is to provide a vapor deposition process using sequential and alternating introduction of a first process material and a second process material, wherein the temperature of the substrate is elevated to a value approximately equal to or greater than the decomposition temperature of the first process material.

These and/or other embodiments of the invention may be provided by a method, for depositing a thin film on a substrate using a vapor deposition process including disposing the substrate in a processing chamber configured to facilitate the vapor deposition process and forming a metal carbide or metal carbonitride film on the substrate by performing one or more vapor deposition process cycles. Each of the process cycles includes exposing the substrate to a first process material within the processing chamber, exposing the substrate to a second process material within the processing chamber and generating plasma in the processing chamber during the exposing of the substrate to the second process material. Also included is elevating a temperature of the substrate to a value approximately equal to or greater than a decomposition temperature of the first process material in order to improve adhesion properties for said metal carbide or metal carbonitride film.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
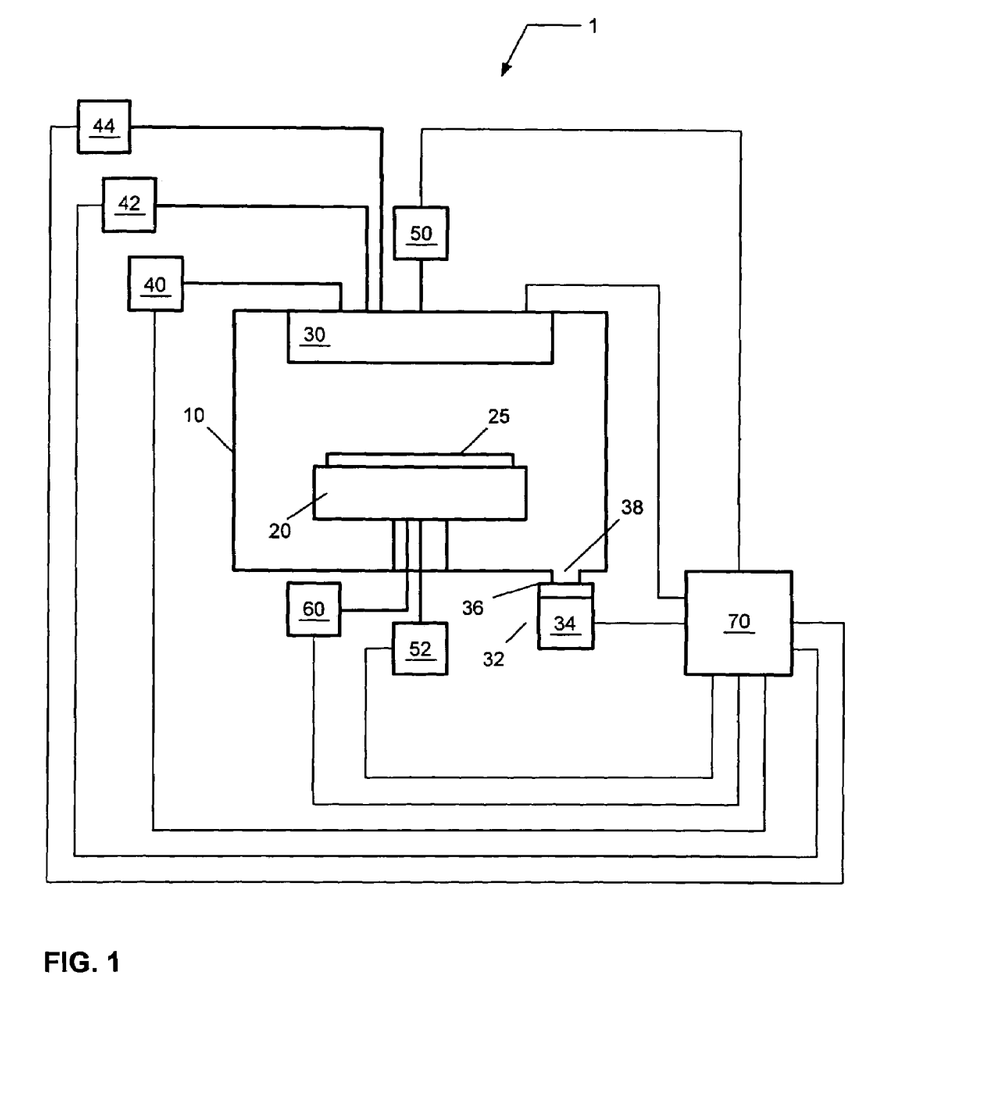
FIG. 1 depicts a schematic view of a deposition system that may be used to implement embodiment of the present invention.

Referring now to the drawings, wherein like reference numerals designate identical or corresponding parts throughout the several views, FIG. 1 illustrates a deposition system 1 for depositing a thin film on a substrate according to one embodiment. For example, during the metallization of interconnect and intra-connect structures for semiconductor devices in back-end-of-line (BEOL) operations, a thin conformal barrier layer may be deposited on wiring trenches or vias to minimize the migration of metal into the inter-level or intra-level dielectric.

The deposition system 1, configured to facilitate a vapor deposition process, comprises a process chamber 10 having a substrate holder 20 configured to support a substrate 25, upon which the thin film is formed. The process chamber 10 further comprises an upper assembly 30 coupled to a first process material supply system 40, a second process material supply system 42, and a purge gas supply system 44. Additionally, the deposition system 1 comprises a first power source 50 coupled to the process chamber 10 and configured to generate plasma in the process chamber 10, and a substrate temperature control system 60 coupled to substrate holder 20 and configured to elevate and control the temperature of substrate 25. Additionally, deposition system 1 comprises a controller 70 that can be coupled to process chamber 10, substrate holder 20, upper assembly 30, first process material supply system 40, second process material supply system 42, purge gas supply system 44, first power source 50, and substrate temperature control system 60.

Alternately, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The deposition system 1 can comprise any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Referring still to FIG. 1, the deposition system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternatingly introduce a first process material to process chamber 10 and a second process material to process chamber 10. The alternation of the introduction of the first material and the introduction of the second material can be cyclical, or it may be a cyclical with variable time periods between introduction of the first and second materials. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a Noble gas (i.e., helium, neon, argon, xenon, krypton), or nitrogen, or hydrogen. Periodically, plasma may be formed from the purge gas to treat the film being formed on the substrate 25. For example, following one or more process cycles for introducing the first process material and the second process material, a noble gas, such as argon, can be introduced to form, for instance, an argon plasma for treating the substrate 25.

Referring still to FIG. 1, the deposition system 1 comprises a plasma generation system configured to generate a plasma during at least a portion of the alternating introduction of the first process material and the second process material to process chamber 10. The plasma generation system can include a first power source 50 coupled to the process chamber 10, and configured to couple power to the first process material, or the second process material, or both in process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

Optionally, the deposition system 1 comprises a substrate bias generation system configured to generate or assist in generating a plasma during at least a portion of the alternating introduction of the first process material and the second process material to process chamber 10. The substrate bias system can include a substrate power source 52 coupled to the process chamber 10, and configured to couple power to substrate 25. The substrate power source 52 may include a radio frequency (RF) generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1 as separate entities, they may indeed comprise one or more power sources coupled to substrate holder 20.

Still referring to FIG. 1, deposition system 1 comprises substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the processing chamber 10 and any other component within the deposition system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials.

The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etch, a 300 to 5000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 1 as well as monitor outputs from deposition system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention, in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1, or it may be remotely located relative to the deposition system 1. For example, the controller 70 may exchange data with the deposition system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
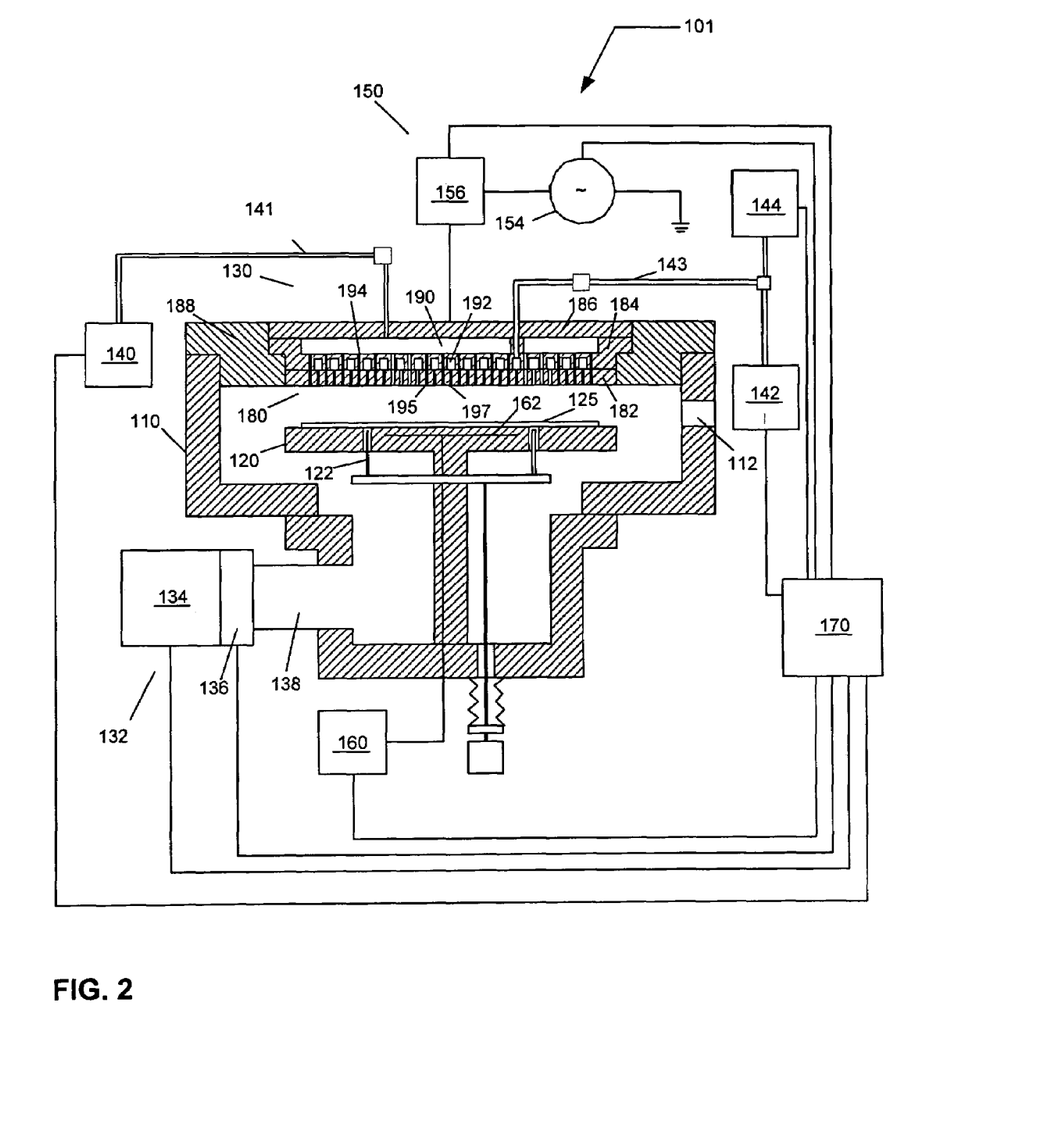
FIG. 2 depicts a schematic view of a deposition system that may be used to implement embodiment of the present invention.

Referring now to FIG. 2, a deposition system 101 is depicted. The deposition system 101 comprises a process chamber 110 having a substrate holder 120 configured to support a substrate 125, upon which the thin film is formed. The process chamber 110 further comprises an upper assembly 130 coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, deposition system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternatingly introduce a first process material to process chamber 110 and a second process material to process chamber 110. The alternation of the introduction of the first material and the introduction of the second material can be cyclical, or it may be a cyclical with variable time periods between introduction of the first and second materials. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to process chamber 110 in a gaseous phase, and with or without a carrier gas. The second process material can, for example, comprises a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

The first process material and the second process material are chosen in accordance with the composition and characteristics of a material to be deposited on the substrate. For example, various metal-containing precursors are utilized for depositing metal carbides or metal carbonitrides. The first process material can comprise a tantalum containing material, a tungsten containing material, a titanium containing material, a copper containing material, an aluminum containing material, a gallium containing material, a hafnium containing material, a molybdenum containing material, a zirconium containing material, or a silicon containing material. For instance, the first process material can include a tantalum containing material for forming tantalum carbide ($TaC_x$, hereinafter TaC) or tantalum carbonitride ($TaC_xN_y$, hereinafter TaCN). The second process material can include a reducing agent.

In one example, when depositing TaC or TaCN, the first process material can include $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$(hereinafter referred to as TAIMATA®; for additional details, see U.S. Pat. No. 6,593,484), or $Ta(NC(CH_3)_3)(N(CH_3)_2)_3$. Additionally, the first process material can include $(CpR_1)(CpR_1)TaH(CO)$, wherein Cp is a cyclopentadienyl functional group, and $R_1$ and $R_2$ may be any combinations of H and alkyl group, including linear and/or branched alkyl groups having from 1 to 8 carbon atoms. For example, the alkyl groups can be methyl (i.e., Me or $CH_3$-), ethyl (i.e., Et or $CH_3CH_2$-), n-propyl (i.e., $^n$Pr or $CH_3CH_2CH_2$-), isopropyl (i.e., $^i$Pr or $(_{CH3})_2CH$—), tert-butyl (i.e., $^t$Bu or $(CH_3)_3C$—) groups, but embodiments of the invention are not limited to those alkyl groups as the $(CpR_1)(CpR_1)TaH(CO)$ precursor may contain other $R_1$, $R_2$ alkyl groups. Additional details for this precursor are described in pending U.S. patent application Ser. No. 11/218,471, entitled "A METHOD OF FORMING A TANTALUM-CONTAINING LAYER FROM A METAL ORGANIC PRECURSOR", the entire contents of which are herein incorporated by reference in its entirety. The second process material can include $H_2$, $NH_3$, $N_2$ and $H_2$, $N_2H_4$, $NH(CH_3)_2$, $N_2H_3CH_3$, silane ($SiH_4$), or disilane ($Si_2H_6$), or a combination thereof.

In another example, when depositing titanium carbide or titanium carbonitride, the first process material can include $Ti[N(C_2H_5CH_3)]_4$ (TEMAT), $Ti[N(CH_3)_2]_4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$, or a combination thereof.

As another example, when depositing tungsten carbide or tungsten carbonitride, the first process material can include bis(tert-butylimido), bis(dimethylamido)tungsten, phenylimido complex $Cl_4(CH_3CN)W(NPh)$, isopropylimido complex $Cl_4(CH_3CN)W(NiPr)$, or allylimido complex $Cl_4(CH_3CN)W(NC_3H_5)$, and the second process material can include $H_2$, $NH_3$, $N_2$ and $H_2$, $N_2H_4$, $NH(CH_3)_2$, or $N_2H_3CH_3$, or a combination thereof.

Additionally, the purge gas supply system 144 can be configured to introduce a purge gas to process chamber 110. For example, the introduction of purge gas may occur between introduction of the first process material and the second process material to process chamber 110, or following the introduction of the second process material to process chamber 110, respectively. The purge gas can comprise an inert gas, such as a Noble gas (i.e., helium, neon, argon, xenon, krypton), or nitrogen, or hydrogen. Periodically, plasma may be formed from the purge gas to treat the film being formed on the substrate 25. For example, following one or more process cycles for introducing the first process material and the second process material, a noble gas, such as argon, can be introduced to form, for instance, an argon plasma for treating the substrate 25.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electro-mechanical (solenoidal) valves, and/or high-rate pulsed gas injection valves. An exemplary pulsed gas injection system is described in greater detail in pending U.S. application 60/272,452, filed on Mar. 2, 2001, which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141 (as shown), the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188.

The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the deposition system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a radio frequency (RF) generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

The system 101 may also include a substrate power system for generating power on substrate holder 120 as described in FIG. 1 above. Substrate bias may permit the alteration of the film properties that may not be achieved by thermal heating of the substrate alone (e.g., the ion energy may be adjusted). Additionally, substrate bias may permit the use of a lower substrate temperature, since the substrate is heated by incident ions. Further yet, substrate bias may allow for the correction of deficiencies in the plasma, i.e., increasing the ion energy to compensate for a low plasma density. Conversely, substrate bias may cause added film damage. Further yet, substrate bias creates additional hardware complexity. Thus, substrate bias is not necessary to the present invention, and it may be preferable not to include a substrate bias.

Still referring to FIG. 2, deposition system 101 comprises substrate temperature control system 160 coupled to the substrate holder 120 and configured to elevate and control the temperature of substrate 125. Substrate temperature control system 160 comprises at least one temperature control element, including a resistive heating element such as an aluminum nitride heater, a metal heater (e.g., aluminum heater), a SUS heater, or a hastelloy heater. The substrate temperature control system 160 can, for example, be configured to elevate and control the substrate temperature up to approximately 400° C. Alternatively, the substrate temperature can, for example, range from approximately 150° C. to 400° C. It is to be understood, however, that the temperature of the substrate is selected based on the desired temperature for creating thin films having good barrier film properties, good adhesion properties for subsequent thin films, etc., as will be described below.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials.

Figure 3:
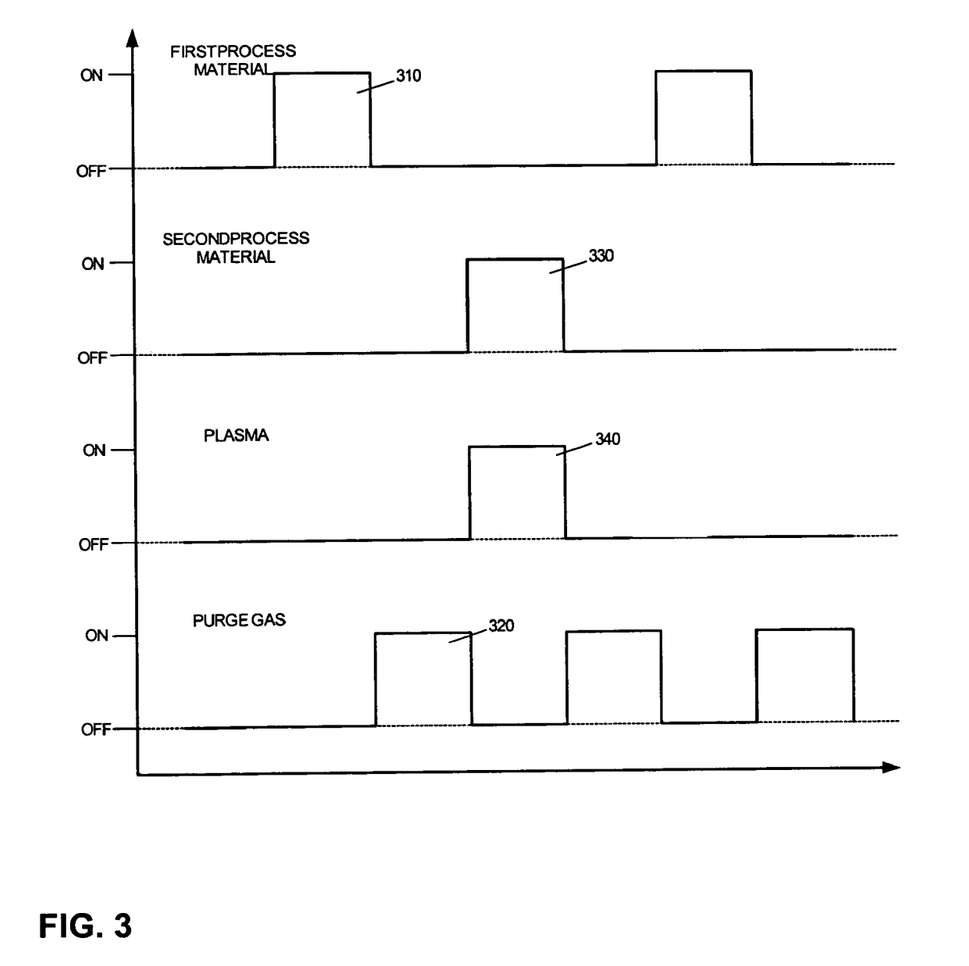
FIG. 3 is a timing diagram for a deposition process that may form a portion of a process according to an embodiment of the invention.

Referring now to FIG. 3, deposition system 1/101 (denoted by FIG. 1/FIG. 2 reference numeral) can be configured to perform a vapor deposition process, such as a plasma enhanced atomic layer deposition (PEALD) process, according to an embodiment of the present invention. FIG. 3 is a timing diagram for an exemplary vapor deposition process in accordance with an exemplary embodiment of the present invention. As seen in this figure, a first process material is introduced to process chamber 10/110 for a first period of time 310 in order to cause adsorption of the film precursor (first process material) on exposed surfaces of substrate 25/125, then the process chamber 10/110 is purged with a purge gas for a second period of time 320. Thereafter, a reducing agent (second process material), is introduced to process chamber 10/110 for a third period of time 330 while power is coupled through the upper assembly 30/130 from the first power source 50/150 to the reducing agent as shown by 340. The coupling of power to the reducing agent heats the reducing agent, thus causing ionization and/or dissociation of the reducing agent in order to form a radical that chemically reacts with the first precursor adsorbed on substrate 25/125. When substrate 25/125 is heated to an elevated temperature, the surface chemical reaction facilitates the formation of the desired film. The process chamber 10/110 is purged with a purge gas for a fourth period of time. The introduction of the first and second process materials, and the formation of plasma can be repeated any number of times to produce a film of desired thickness on the substrate.

As shown in FIG. 3, the vapor deposition process proceeds through a cycle by introducing a film precursor to the processing system during a first step, followed by purging the processing system. Thereafter, a reduction gas is introduced to the processing system and plasma is formed by coupling power to the reduction gas during a second step, followed by another purging of the processing system. While FIG. 3 shows the plasma step 340 exactly corresponding to the second process material step 330, it is sufficient that these steps merely overlap.

The present inventor has observed that there exist at least two regimes within which films can be grown using vapor deposition processes. For example, films may be grown in a first regime that is ALD (atomic layer deposition) like, wherein the substrate temperature is less than a decomposition temperature of the first process material (or film precursor) and the film growth rate is less than or equal to one monolayer per process cycle. Additionally, for example, films may be grown in a second regime that is CVD (chemical vapor deposition) like, wherein the substrate temperature is greater than a decomposition temperature of the first process material (or film precursor) and the film growth rate is greater than one monolayer per process cycle.

Furthermore, the inventor has observed that, when forming metal carbide or metal carbonitride films, such as tantalum carbide or tantalum carbonitride, using a vapor deposition process, such as the process described in FIG. 3 performed at a predetermined temperature, for a conformal barrier film in a BEOL structure, the carbon content of the thin film can be increased relative to the metal (e.g., Ta), and improved adhesion for subsequent metal deposition, such as a copper seed layer, can result. As such, copper wettability can be improved (i.e., copper agglomeration is reduced) on both flat surfaces (i.e., flat-field, and trench/via bottom) and side-wall surfaces.

According to one embodiment, a vapor deposition process, such as the process described in FIG. 3, is performed having one or more process cycles, each process cycle including exposing the substrate to the first process material, such as a film precursor, exposing the substrate to a second process material, such as a reducing agent; and forming plasma during the exposure of the substrate to the second process material. Additionally, the temperature of the substrate is elevated to a value approximately equal to or greater than the decomposition temperature of the first process material, such that the vapor deposition process operates in the "CVD-like" regime while still maintaining acceptable film conformality as in an "ALD-like" regime. As known to one of ordinary skill in the art, vapor decomposition temperature depends on the material composition. Further, the extent to which substrate temperature exceeds the vapor decomposition temperature may depend on process considerations, thermal budget for the process and or other considerations.

In one example, a vapor deposition process using one or more process cycles is performed for depositing a TaCN film from a metal organic film precursor, such as TAIMATA®. Table 1 presents an exemplary parameter set for a process cycle in a vapor deposition process. The row labeled "TAIMATA" represents the first step (or introduction of film precursor), and the row labeled "$H_2$" represents the second step (or introduction of a reduction gas and formation of a reduction plasma). The process parameters include: mass flow rate of TAIMATA (mg/min, milligrams/minute); flow rate of argon (Ar) carrier gas (sccm, standard cubic centimeters per minute); flow rate of hydrogen ($H_2$) (sccm); flow rate of argon (independent of film precursor and carrier gas) (sccm); the time of the respective step or purge step (sec, seconds); the RF (radio frequency) power (W, watts) coupled to the reduction gas; the chamber pressure (Torr); and the setting for the auto pressure controller (APC) ("hold" represents fixed angular position for butterfly vacuum valve).

TABLE 1

|  | TAIMATA [mg/min] | Carrier Ar [sccm] | $H_2$ [sccm] | Ar10 [sccm] | Time [sec] | Power [W] | Press. [Torr] | APC [deg] |
|---|---|---|---|---|---|---|---|---|
| TAIMATA | 90 | 200 | 0 | 500 | 5 |  |  | Hold |
| Purge | 0 | 0 | 2000 | 0 | 3 |  |  | Hold |
| $H_2$ | 0 | 0 | 2000 | 0 | 20 | 300 | 0.4 |  |
| Purge | 0 | 0 | 0 | 0 | 3 |  |  | Hold |

Figure 4:
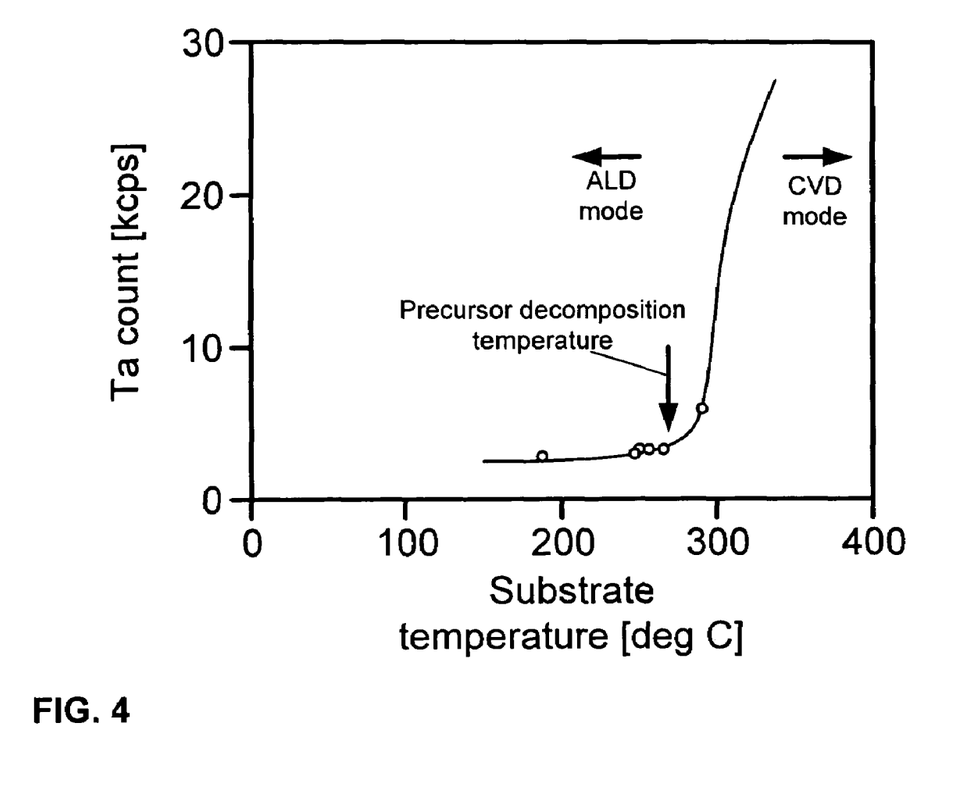
FIG. 4 presents exemplary vapor deposition process data.
Figure 5:
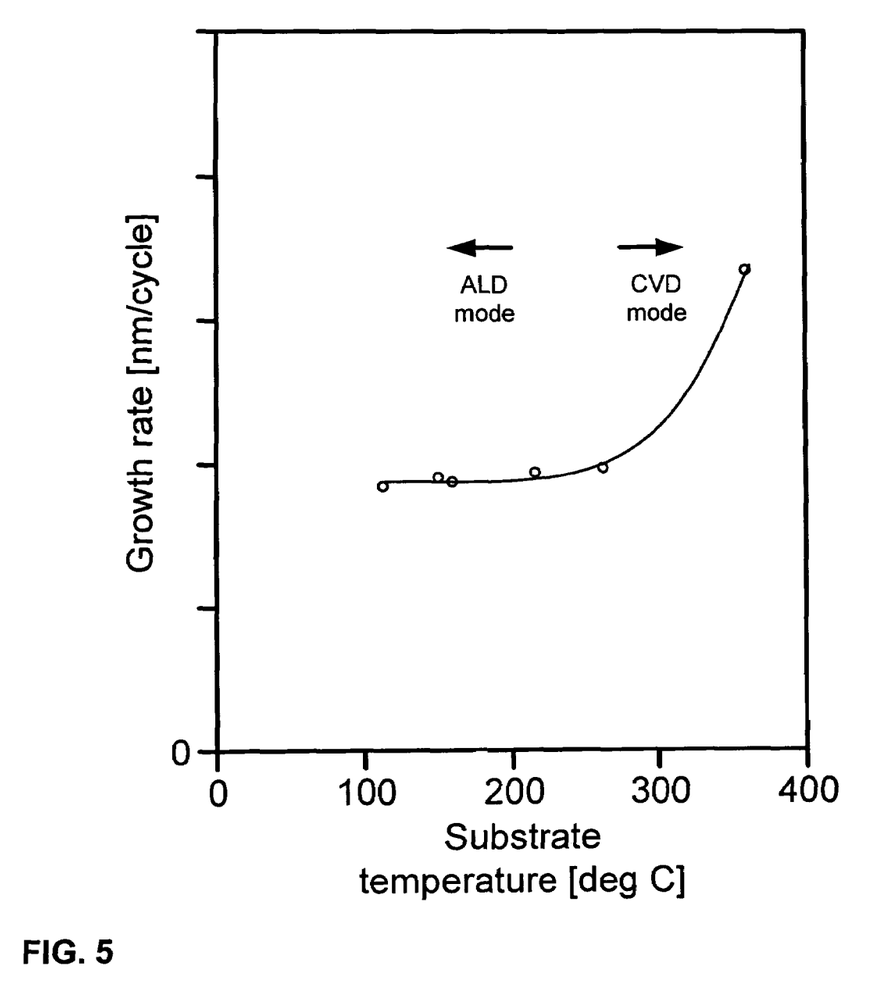
FIG. 5 presents additional exemplary vapor deposition data.

As shown in FIG. 4, the amount of Ta (kcps, kilocounts per second) is measured, using X-ray fluorescence (XRF) spectroscopy, while the substrate temperature is varied from approximately 150 degrees C. to approximately 350 degrees C. during the above-noted TaCN deposition process. At a substrate temperature of approximately 253 degrees C., the Ta count substantially increases, thus indicating thermal decomposition of the Ta precursor. Additionally, as shown in FIG. 5, the growth rate of the film (nm/cycle, nanometers per cycle) maintains a substantially flat profile up to approximately the film precursor decomposition temperature, beyond which the growth rate dramatically increases.

Figure 6:
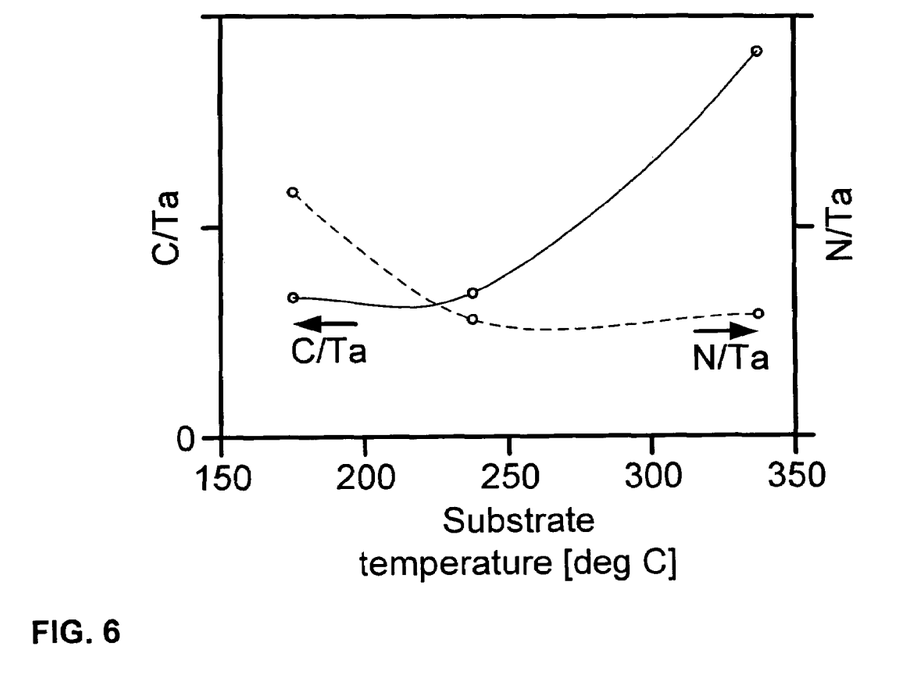
FIG. 6 presents additional exemplary vapor deposition data.

Referring now to FIG. 6, the ratio of carbon counts to Ta counts (C/Ta) and the ratio of nitrogen counts to Ta counts (N/Ta) are shown as a function of substrate temperature. As seen in this Figure, when the substrate temperature increases above the film precursor decomposition temperature, the carbon content in the thin film increases, while the nitrogen content levels out.

The present inventors conducted tests to determine conformality, or step coverage, of a TaCN film to 100 nm features having an aspect ratio of approximately 4.5-to-1. The inventors discovered that for a first vapor deposition process at a substrate temperature of 180 degrees C. (e.g., ALD-like regime) and for a second vapor deposition process at a substrate temperature of 344 degrees C. (e.g., CVD-like regime), SEM photographs indicate step coverage of the features being greater than 90% for both processes. However, in the ALD-like regime deposition process, copper agglomeration is observed during deposition of the succeeding copper film when no (argon) plasma treatment of the Ta-containing film is performed. Conversely, in the CVD-like regime vapor deposition process, copper agglomeration is not observed during the deposition of the succeeding copper film when no plasma treatment of the Ta-containing film is performed. In either case, (argon) plasma treatment may be employed to further improve film properties at the expense of throughput. Further, plasma excited hydrogen or atomic hydrogen treatment of the deposited film may be used to modify the film, such as by altering the carbon content. Such methods are disclosed in patent application Ser. No. 11/373,263, titled "METHOD OF INTEGRATING PEALD TA-CONTAINING FILMS INTO Cu METALLIZATION", and filed on Mar. 20, 2006. The entire content of this application is incorporated herein by reference.

Thus, the inventors discovered that improved adhesion properties of a deposited film can be achieved in a CVD-like deposition regime while maintaining acceptable levels of step coverage. Further, deposition at substrate temperatures in the CVD regime can improve deposition rate for the film. As would be understood by one of ordinary skill in the art, acceptable step coverage may vary for different processes and products. For devices requiring a high degree of step coverage, the deposition substrate temperature will approach the ALD regime where deposition rates are lower, while for devices requiring a lower degree of step coverage, the deposition substrate temperature can be increased further into the CVD regime where deposition rates are higher. Further, substrate temperature may be changed during the deposition process to operate in both the ALD-like regime and the CVD-like regime during deposition. For example, it may be desirable to operate in a pure ALD-like regime during initial deposition of the film to obtain good initial conformality, and operate in the higher deposition rate CVD-like regime thereafter to improve adhesion. Adhesion properties of the deposited film may also be less important during initial deposition cycles, as subsequently deposited metals may not bond with this portion of the barrier layer, for example.

Figure 7:
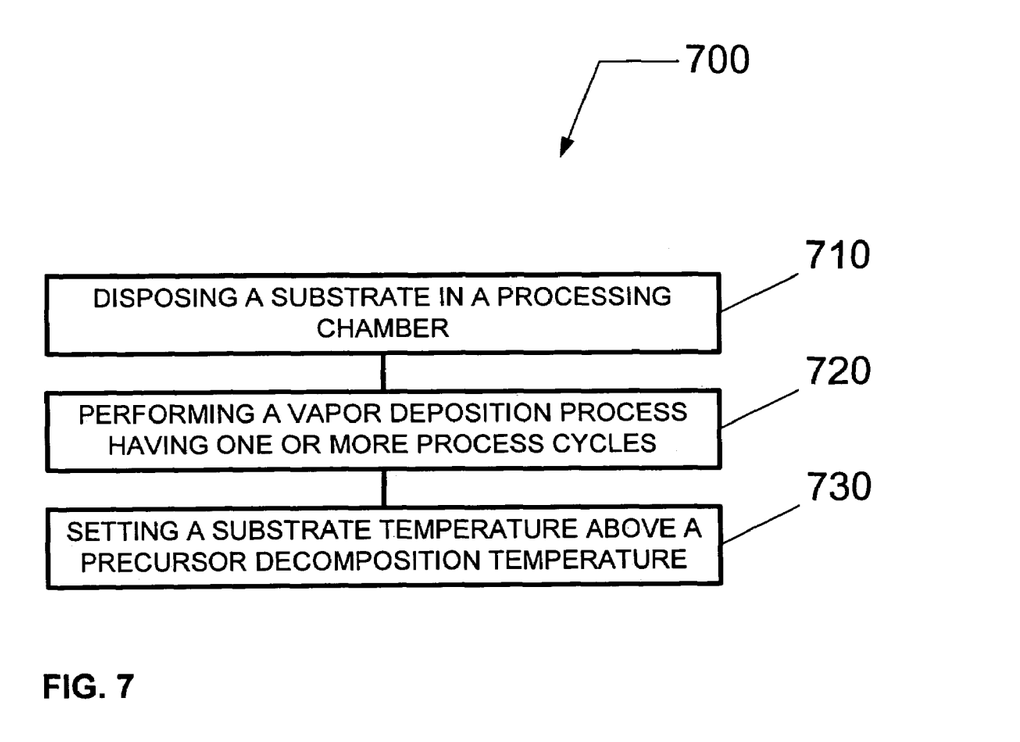
FIG. 7 presents a method of depositing a thin film using a vapor deposition process according to an embodiment of the invention.

FIG. 7 presents a method of depositing a thin film using a vapor deposition process according to one embodiment. The method comprises flow chart 700 beginning in 710 with disposing the substrate in a processing chamber configured to facilitate the vapor deposition process. The processing chamber can, for example, include a processing chamber as described in FIG. 1 or 2.

In 720, a vapor deposition process, such as the process described in FIG. 3, is performed having one or more process cycles, wherein each process cycle includes exposing the substrate to the first process material, such as a film precursor, exposing the substrate to a second process material, such as a reducing agent, and forming plasma during the exposure of the substrate to the second process material. One or more of the one or more process cycles may be performed at a first power level during the plasma reduction step, and one or more of the one or more process cycles can be performed at a second power level during the plasma reduction step, wherein the second power level exceeds the first power level. For additional details, initial film properties can be tailored using the power level during the plasma reduction step, see pending U.S. patent application Ser. No. 11/206,994, entitled "METHOD OF PREPARING A FILM LAYER-BY-LAYER USING PLASMA ENHANCED ATOMIC LAYER DEPOSITION", the entire content is incorporated herein by reference in its entirety.

In 730, the temperature of the substrate is elevated to a value approximately equal to or greater than the decomposition temperature of the first process material, such that the vapor deposition process operates in the "CVD-like" regime. While still maintaining, for example, acceptable film conformality with step coverage greater than 90%, thin films of metal carbide or metal carbonitride are deposited with higher carbon content and good adhesion properties for subsequent metal film deposition. For instance, when using TAIMATA® as the first process material (or film precursor), the substrate temperature is elevated to approximately 253 degrees C. or greater. Alternatively, for example, the substrate temperature is elevated to approximately 300 degrees C. or greater. Alternatively yet, the substrate temperature is elevated to approximately 340 degrees C. or greater. Such elevated temperatures may be maintained during the entire deposition process, or during only a portion of the deposition process such that ALD/CVD regimes may be used in combination as discussed above.

While the mechanism of the present invention that improves adhesion properties of a film is not precisely known, improvements in adhesion may be correlated to carbon content. Thus, when depositing TaC or TaCN, the temperature of the substrate is elevated to a value where the ratio of the amount of C to the amount of Ta in the TaC or TaCN film measured using X-ray fluorescence (XRF) spectroscopy exceeds a value of approximately 0.1475. Alternatively yet, the temperature of the substrate is elevated to a value where the ratio of the amount of C to the amount of Ta in the TaC or TaCN film measured using X-ray fluorescence (XRF) spectroscopy exceeds a value of approximately 0.15. Still alternatively yet, the temperature of the substrate is elevated to a value where the ratio of the amount of C to the amount of Ta in the TaC or TaCN film measured using X-ray fluorescence (XRF) spectroscopy exceeds a value of approximately 0.1525.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method of depositing a thin film on a substrate, having a feature formed thereon, using a vapor deposition process, comprising:

identifying a degree of step coverage required for the thin film on the feature based on a process performed on the substrate, a product to be produced from the substrate or both the process performed and the product produced;

disposing said substrate in a processing chamber configured to facilitate said vapor deposition process;

forming a metal carbide or metal carbonitride film on said substrate by performing one or more vapor deposition process cycles, each process cycle comprising:

exposing said substrate to a first process material within said processing chamber;

after the exposing the substrate to the first process material, introducing a purge gas to said processing chamber to purge the processing chamber of the first process material;

after the introducing the purge gas, exposing said substrate to a second process material within said processing chamber; and generating a local plasma in said processing chamber during said exposing of said substrate to said second process material; and after the performing the one or more vapor deposition process cycles, elevating a temperature of said substrate during the forming step to a value greater than a decomposition temperature of said first process material but less than a temperature at which the identified degree of step coverage cannot be achieved and performing one or more additional vapor deposition process cycles at the elevated temperature in order to improve adhesion properties for said metal carbide or metal carbonitride film by altering the carbon content therein.

2. The method of claim 1, wherein said forming comprises forming a metal carbide or metal carbonitride film having Ta, Ti, or W therein.

3. The method of claim 1, wherein said forming comprises forming a TaC or TaCN film.

4. The method of claim 3, wherein said exposing said substrate to said first process material comprises exposing said substrate to $Ta(NC(CH_3)_2C_2H_5)(N(CH_3)_2)_3$.

5. The method of claim 4, wherein said elevating comprises elevating the temperature of said substrate to a decomposition temperature of 253 degrees C. or greater but less than said temperature at which the identified degree of step coverage cannot be achieved.

6. The method of claim 5, wherein said elevating comprises elevating the temperature of said substrate to 300 degrees C. or greater but less than said temperature at which the identified degree of step coverage cannot be achieved.

7. The method of claim 6, wherein said elevating comprises elevating the temperature of said substrate to approximately 340 degrees C. or greater but less than said temperature at which the identified degree of step coverage cannot be achieved.

8. The method of claim 4, wherein:
said forming comprises forming a TaCN film on the substrate,
said exposing said substrate to said first process material comprises exposing the substrate to a gas flow of 90 mg/mm of $Ta(NC(CH_3)_2C_2H_5)(N(CH_3)_2)_3$, 200 sccm of Argon carrier gas and 500 scorn of Argon 10 for a period of 5 seconds,
said exposing said substrate to said second process material comprises exposing the substrate to 2000 scorn of $H_2$ for a period of 20 seconds,
said generating a plasma comprises generating a local plasma local to the substrate.

9. The method of claim 3, wherein said elevating comprises elevating the temperature of said substrate to a value where the ratio of the amount of C to the amount of Ta in said TaC or TaCN film measured using X-ray fluorescence (XRF) spectroscopy exceeds a value of approximately 0.1475.

10. The method of claim 9, wherein said elevating comprises elevating the temperature of said substrate to a value where the ratio of the amount of C to the amount of Ta in said TaC or TaCN film measured using X-ray fluorescence spectroscopy exceeds a value of approximately 0.15.

11. The method of claim 10, wherein said elevating comprises elevating the temperature of said substrate to a value where the ratio of the amount of C to the amount of Ta in said TaC or TaCN film measured using X-ray fluorescence spectroscopy exceeds a value of approximately 0.1525.

12. The method of claim 9, wherein said elevating comprises elevating the temperature of said substrate to a value where a ratio of the amount of C to the amount of Ta in said TaC or TaCN film measured using X-ray fluorescence (XRF) spectroscopy is from 0.1475 to 0.1525.

13. The method of claim 1, wherein said exposing said substrate to said first process material comprises exposing said substrate to a tantalum containing material including one or more of $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$.

14. The method of claim 1, wherein said exposing said substrate to a second process material comprises exposing said substrate to a process material comprising at least one of $H_2$, $N_2$, $O_2$, $H_2O$, $NH_3$, $H_2O_2$, $SiH_4$, or $SiH_6$.

15. The method of claim 1, wherein said generating plasma comprises coupling electromagnetic power to at least one of a plasma electrode and a substrate holder of the processing chamber.

16. The method of claim 1, further comprising exposing said substrate to at least one of said first and second process materials using a carrier gas.

17. The method of claim 1, wherein said introducing the purge gas comprises introducing an inert gas to said processing chamber.

18. The method of claim 1, further comprising following one or more of said one or more vapor deposition process cycles, exposing said substrate to plasma formed from a noble gas.

19. The method of claim 18, wherein said exposing said substrate to plasma formed from a noble gas comprises exposing said substrate to an argon plasma.

20. The method of claim 1, wherein said forming a metal carbide or metal carbonitride film comprises performing one or more vapor deposition process cycles using plasma formed at a first power level and performing one or more vapor deposition process cycles using plasma formed at a second power level different from said first power level.

21. The method of claim 1, wherein said elevating comprises changing said temperature of the substrate from below said vapor decomposition temperature to above the vapor decomposition temperature during said forming step.

22. The method of claim 1, wherein said forming comprises forming a barrier or seed layer, or a combination thereof on the feature of a substrate.

23. The method of claim 1, wherein said forming comprises maintaining a temperature of the substrate at a first value below a decomposition temperature for a portion of the forming, and maintaining a temperature of the substrate at a second value above a decomposition temperature for another portion of the forming.

24. The method of claim 1, wherein said elevating comprises maintaining said temperature at said value during an entire duration of the forming step.

25. The method of claim 1, wherein said forming comprises forming the film in a pure ALD regime during initial deposition of the film to obtain initial conformality, and then performing said elevating to form the film in a CVD regime to achieve improved adhesion.

* * * * *